(12) United States Patent
Collins

(10) Patent No.: US 7,025,866 B2
(45) Date of Patent: Apr. 11, 2006

(54) MICROELECTRONIC WORKPIECE FOR ELECTROCHEMICAL DEPOSITION PROCESSING AND METHODS OF MANUFACTURING AND USING SUCH MICROELECTRONIC WORKPIECES

(75) Inventor: Dale W. Collins, Boise, ID (US)

(73) Assignee: Micron Technology, Inc., Boise, ID (US)

(*) Notice: Subject to any disclaimer, the term of this patent is extended or adjusted under 35 U.S.C. 154(b) by 474 days.

(21) Appl. No.: 10/225,585

(22) Filed: Aug. 21, 2002

(65) Prior Publication Data

US 2004/0038052 A1    Feb. 26, 2004

(51) Int. Cl.
C25D 5/02    (2006.01)
(52) U.S. Cl. ...................... 205/118; 205/123
(58) Field of Classification Search ................ 205/118, 205/123, 220–223, 157, 291, 122, 126, 183; 438/687
See application file for complete search history.

(56) References Cited

U.S. PATENT DOCUMENTS

| | | |
|---|---|---|
| 3,267,010 A | 8/1966 | Creutz et al. |
| 3,328,273 A | 6/1967 | Creutz et al. |
| 3,664,933 A | 5/1972 | Clauss |
| 3,716,462 A | 2/1973 | Jensen |
| 3,770,598 A | 11/1973 | Creutz |
| 3,878,066 A | 4/1975 | Dettke et al. |
| 3,930,963 A | 1/1976 | Polichette et al. |
| 4,000,046 A | 12/1976 | Weaver |
| 4,134,802 A | 1/1979 | Herr et al. |
| 4,272,335 A | 6/1981 | Combs |
| 4,279,948 A | 7/1981 | Kukanskis et al. |
| 4,417,956 A | 11/1983 | McCoy |
| 4,576,689 A | 3/1986 | Makkaev et al. |
| 4,624,749 A | 11/1986 | Black et al. |
| 4,959,278 A | 9/1990 | Shimauchi et al. |
| 4,990,224 A | 2/1991 | Mahmoud |

(Continued)

FOREIGN PATENT DOCUMENTS

GB    2 285 174 A    6/1995

(Continued)

OTHER PUBLICATIONS

Yung, E.K. and Romankiw, L.T., "Fundamental Study of Acid Copper Through-Hole Electroplating Process," Journal of The Electrochemical Society, vol. 136, No. 3, pp. 756-767, Mar. 1989, The Electrochemical Society, Inc., Pennington, New Jersey.

(Continued)

Primary Examiner—Nam Nguyen
Assistant Examiner—Luan V. Van
(74) Attorney, Agent, or Firm—Perkins Coie LLP

(57) ABSTRACT

Methods for forming microelectronic workpieces used in electrochemical deposition processes, methods of depositing a conductive layer on a microelectronic workpiece, and articles for electrochemical deposition in semiconductor fabrication. One aspect of the invention is directed toward methods for forming microelectronic workpieces that are well-suited for electrochemical deposition processes. On embodiment of such a method comprises depositing a first conductive material on a workpiece to form an electrically conductive first layer that conforms to the workpiece. This embodiment further includes forming a seed region defined by a second layer of a second conductive material on the first layer, and forming a contact region defined by an exposed portion of the first layer that is not covered by the second layer. The contact region can extend around at least a portion of the perimeter of the workpiece.

40 Claims, 13 Drawing Sheets

U.S. PATENT DOCUMENTS

| | | | |
|---|---|---|---|
| 5,021,129 | A | 6/1991 | Arbach et al. |
| 5,115,430 | A | 5/1992 | Hahne et al. |
| 5,116,430 | A | 5/1992 | Hirai et al. |
| 5,151,168 | A | 9/1992 | Gilton et al. |
| 5,161,168 | A | 11/1992 | Schilling |
| 5,209,817 | A | 5/1993 | Ahmad et al. |
| 5,256,274 | A | 10/1993 | Poris |
| 5,284,548 | A | 2/1994 | Carey et al. |
| 5,368,711 | A | 11/1994 | Poris |
| 5,372,848 | A | 12/1994 | Blackwell et al. |
| 5,409,587 | A | 4/1995 | Sandhu et al. |
| 5,443,865 | A | 8/1995 | Tisdale et al. |
| 5,472,592 | A | 12/1995 | Lowery |
| 5,482,891 | A | 1/1996 | Shieh et al. |
| 5,549,808 | A | 8/1996 | Farooq et al. |
| 5,576,052 | A | 11/1996 | Arledge et al. |
| 5,639,316 | A | 6/1997 | Cabral, Jr. et al. |
| 5,674,787 | A | 10/1997 | Zhao et al. |
| 5,695,810 | A | 12/1997 | Dubin et al. |
| 5,719,447 | A | 2/1998 | Gardner |
| 5,723,387 | A | 3/1998 | Chen |
| 5,730,854 | A | 3/1998 | Martin |
| 5,750,018 | A | 5/1998 | Brasch |
| 5,788,778 | A | 8/1998 | Shang et al. |
| 5,824,599 | A | 10/1998 | Schacham-Diamand et al. |
| 5,882,498 | A | 3/1999 | Dubin et al. |
| 5,891,513 | A | 4/1999 | Dubin et al. |
| 5,897,368 | A | 4/1999 | Cole, Jr. et al. |
| 5,908,543 | A | 6/1999 | Matsunami et al. |
| 5,913,147 | A | 6/1999 | Dubin et al. |
| 5,932,077 | A | 8/1999 | Reynolds |
| 5,932,286 | A | 8/1999 | Beinglass et al. |
| 5,969,422 | A | 10/1999 | Ting et al. |
| 5,972,192 | A | 10/1999 | Dubin et al. |
| 6,036,836 | A | 3/2000 | Peeters et al. |
| 6,065,424 | A | 5/2000 | Shacham-Diamand et al. |
| 6,069,068 | A | 5/2000 | Rathore et al. |
| 6,109,206 | A | 8/2000 | Maydan et al. |
| 6,113,771 | A | 9/2000 | Landau et al. |
| 6,140,234 | A * | 10/2000 | Uzoh et al. ................ 438/678 |
| 6,197,181 | B1 | 3/2001 | Chen |
| 6,197,688 | B1 | 3/2001 | Simpson |
| 6,210,781 | B1 | 4/2001 | Baum et al. |
| 6,290,833 | B1 | 9/2001 | Chen |
| 6,309,524 | B1 | 10/2001 | Woodruff et al. |
| 6,319,831 | B1 | 11/2001 | Tsai et al. |
| 6,329,297 | B1 | 12/2001 | Balish et al. |
| 6,374,831 | B1 | 4/2002 | Chandran et al. |
| 6,387,207 | B1 | 5/2002 | Janakiraman et al. |
| 6,413,383 | B1 | 7/2002 | Chiang |
| 6,413,436 | B1 * | 7/2002 | Aegerter et al. ............. 216/13 |
| 6,482,307 | B1 * | 11/2002 | Ashjaee et al. ............ 205/103 |
| 6,632,345 | B1 | 10/2003 | Chen |
| 6,638,410 | B1 | 10/2003 | Chen |
| 6,790,776 | B1 * | 9/2004 | Ding et al. ................ 438/685 |
| 2002/0000382 | A1 | 1/2002 | Morrissey et al. |
| 2002/0043466 | A1 | 4/2002 | Dordi et al. |
| 2003/0141194 | A1 | 7/2003 | Chen |

FOREIGN PATENT DOCUMENTS

| | | |
|---|---|---|
| JP | 52-16433 | 2/1977 |
| JP | 6-349952 A | 12/1994 |
| WO | WO 99/47731 A1 | 9/1999 |

OTHER PUBLICATIONS

Yung, E.K. and Romankiw, L.T., "Plating of Copper into Through-Holes and Vias," Journal of The Electrochemical Society, vol. 136, No. 1, pp. 206-216, Jan. 1989, The Electrochemical Society, Inc., Pennington, New Jersey.

Ali, H.O. and Christie, I.R.A., "A Review of Electroless Gold Deposition Processes," Gold Bulletin, vol. 17, No. 4, pp. 118-127, 4th quarter 1984, International Gold Corp., Marshalltown, South Africa, month not avail.

Benedetti, A.V. et al., "Electrochemical Studies of Copper, Copper-Aluminum and Copper-Aluminum-Silver Alloys: Impedance Results in 0.5M NaCI," Electrochimica Acta, vol. 40, 12 pages, Mar. 1995, Pergamon, Great Britain.

Bindra, P. and White, J.R., "Chapter 12: Fundamental Aspects of Electroless Copper Plating," Electroless Plating: Fundamentals & Applications, G.O. Mallory and J.B. Hajdu, editors, pp. 289-329, Dec. 1990, Noyes Publications.

Chassaing, E. et al., "Kinetics of Copper Electrodeposition in Citrate," Journal of Applied Electrochemistry, vol. 16, pp. 591-604, 1986, Chapman and Hall Ltd., New York, month n/a.

Chen L. and Ritzdorf T., "ECD Seed Layer for Inlaid Copper Metallization," presented at the 195th meeting of The Electrochemical Society in Symposium G1, May 2-6, 1999, Seattle, Washington, published in Processing in ULSI Fabrication and Semiconductor/Metal Deposition II, Proceedings of the International Symposium, pp. 122-133, edited by P.C. Andricacos et al., Sep. 1999, The Electrochemical Society, Inc., Pennington, New Jersey.

Chen L. et al., "Submicron Copper Metallization by Electrochemical Deposition," Advanced Metallization Conference in 1998: Proceedings of the Conference Held Oct. 6-8, 1998, in Colorado Springs, Colorado, pp. 111-116, edited by N. Kobayashi et al., Sep. 1999, Materials Research Society, Pittsburgh, Pennsylvania.

Chen, M. et al., "Room Temperature Self-Annealing of Electroplated and Sputtered Copper Films," Advanced Interconnects and Contacts, Materials Research Society Symposium Proceedings vol. 564, pp. 413-420, Materials Research Society, Warrendale, Pennsylvania, Symposium held Apr. 5-7, 1999 in San Francisco, California.

Deckert, C.A., "Electroless Copper Plating. A Review: Part 1," Plating & Surface Finishing, pp. 48-55, Feb. 1995, American Electroplaters and Surface Finishers Society, Inc., Orlando, Florida.

DeSilva, M.J. and Shacham-Diamand, Y., "A Novel Seed Layer Scheme to Protect Catalytic Surfaces for Electroless Deposition," Journal of the Electrochemical Society, vol. 143, No. 11, pp. 3512-3516, Nov. 1996, The Electrochemical Society, Inc., Pennington, New Jersey.

Despić, A.R., "Deposition and Dissolution of Metals and Alloys. Part B: Mechanisms, Kinetics, Texture, and Morphology," Comprehensive Treatise of Electrochemistry: vol. 7: Kinetics and Mechanisms of Electrode Processes, B.E. Conway et al., editors, pp. 451-528, Jul. 1983, Plenum Press, New York.

Dubin, V. et al., "Copper Electroplating for On-Chip Metallization," Advanced Micro Devices, Sunnyvale, California, date n a.

Dubin, V.M. et al., "Copper Plating Techniques For ULSI Metallization," Advanced Metallization and Internconnect Systems for ULSI Applications in 1997, Proceedings of the Materials Research Society Conference held Sep. 30-Oct. 2, 1997 in San Diego, California, R. Cheung et al., editors, pp. 405-411, 1998, Materials Research Society, Warrendale, Pennsylvania.

Dubin, V.M. et al., "Selective and Blanket Electroless Copper Deposition for Ultralarge Scale Integration," Journal of the Electrochemical Society, vol. 144, No. 3, pp. 898-908, Mar. 1997, The Electrochemical Society, Inc., Pennington, New Jersey.

Dubin, V.M. et al., "Sub-Half Micron Electroless Cu Metallization," Advanced Metallization for Future ULSI, Materials Research Society Symposium Proceedings held Apr. 8-11, 1996 in San Francisco, California, K.N. Tu et al., editors, vol. 427, pp. 179-184, Jun. 1, 1996, Materials Research Society, Warrendale, Pennsylvania.

El-Tantawy, Y.A. et al., "Nature and Mechanism of Anodic Film Formation on Cu in Alkaline Phosphate Media," Journal of Electroanalytical Chemistry, vol. 125, pp. 321-331, 1981, Elsevier Sequoia S.A., Lausanne, Switzerland, month n a.

Faust, R. and Jiang, Q., "Barrier Effect on Electroplated Cu Films," Advanced Interconnects and Contacts, Materials Research Society Symposium Proceedings vol. 564, pp. 421-427, Materials Research Society, Warrendale, Pennsylvania, Symposium held Apr. 5-7, 1999 in San Francisco, California.

Fujinami, T. and Honma, H., "Electroless Copper Plating on PZT Ceramic," Plating & Surface Finishing, May 1998, pp. 100-104, American Electroplaters and Surface Finishers Society, Inc., Orlando, Florida.

Gabe, D.R., Principles of Metal Surface Treatment and Protection, Second Edition, 1978, Chapters 1, 2 and 8, pp. 1-79, 179-198, Pergamon Press, New York, month n a.

Gignac, L.M. et al., "Characterization of Plated Cu Thin Film Microstructures," Advanced Interconnects and Contacts, Materials Research Society Symposium Proceeding vol. 564, pp. 373-378, Materials Research Society, Warrendale, Pennsylvania, Symposium held Apr. 5-7, 1999 in San Francisco, California.

Khera, R.P., "The Basic Principles of Electrolytic Deposition," pp. 69-84.

Kohl, P.A., "Chapter 2: Electrodeposition of Gold," Modern Electroplating, Fourth Edition, M. Schlesinger and M. Paunovic, editors, pp. 201-225, Aug. 10, 2000, Wiley-Interscience, New York.

Krishnan, R.M. et al., "Electroplating of Copper from a Non-Cyanide Electrolyte," Plating & Surface Finishing, vol. 82, No. 7, pp. 56-59, Jul. 1995, American Electroplaters and Surface Finishers Society, Inc., Orlando, Florida.

Kröger, R. et al., "Properties of Copper Films Prepared by Chemical Vapor Deposition for Advanced Metallization of Microelectronic Devices," Journal of The Electrochemical Society, vol. 146, No. 9, pp. 3248-3254, Sep. 1999, The Electrochemical Society, Inc., Pennington, New Jersey.

Li, J. et al., "Oxidation and Protection In Copper Alloy Thin Films," Journal of Applied Physics, vol. 70, No. 5, Sep. 1, 1991, American Institute of Physics, College Park, Maryland.

Lopatin, S. and Shacham-Diamand, Y., "Conformal Electroless Copper Deposition For Sub-0.5µm Interconnect Wiring of Very High Aspect Ratio," Proceedings of the Third Symposium on Electrochemically Deposited Thin Films, San Antonio, Texas, Oct. 1996, Proceedings vol. 96-19, pp. 271-288, M. Paunovic and D.A. Scherson, editors, The Electrochemical Society, Inc., Pennington, New Jersey.

Lopatin, S. et al., "Electroless Cu and Barrier Layers for Sub-Half Micron Multilevel Interconnects," Proceedings of SPIE, vol. 3214, pp. 21-32, Sep. 1997, SPIE—The International Society for Optical Engineers, Bellingham, Washington.

Lopatin, S. et al., "Extendability of Ion-Metal Plasma and Electroplating Technologies for Damascence-Based Copper Metallization," Advanced Metallization Conference in 1998: Proceedings of the Conference Held Oct. 6-8, 1998 in Colorado Springs, Colorado, K. Nobuyoshi et al., editors, 7 pages, Sep. 1, 1999, Materials Research Society, Warrendale, Pennsylvania.

Matsuoka, M. et al., "Kinetics of Electroless Copper Plating and Mechanical Properties of Deposits," Journal of The Electrochemical Society, vol. 139, No. 9 pp. 2466-2470, Sep. 1992, The Electrochemical Society, Inc., Pennington, New Jersey.

Mikkola, R.D. et al., "Bath Additives and Current Density Efects on Copper Electroplating Fill of Cu Damascence Structures," Advanced Interconnects and Contacts, Materials Research Society Symposium Proceedings vol. 564, pp. 399-405, Materials Research Society, Warrendale, Pennsylvania, Symposium held Apr. 5-7, 1999 in San Francisco, California.

Mikkola, R.D. et al., "Investigation of the Roles of the Additive Components for Second Generation Copper Electroplating Chemistries Used for Advanced Interconnect Metallization,", date n a.

Murarka, S.P. and Hymes, S.W., "Copper Metallization for ULSI and Beyond," Critical Reviews in Solid State and Materials Sciences, vol. 20, No. 2, pp. 87-124, 1995, CRC Press, Inc., Boca Raton, Florida.

Murarka, S.P., Metallization: Theory and Practice for VLSI and ULSI, 250 pages, Jan. 1993, Butterworth-Heinemann, Stoneham, Massachusetts.

Nobe, K., "Electrodissolution Kinetics of Metals and Alloys," Department of Chemical Egineering, University of California, Los Angeles, date n a.

Oskam, G. et al., "Electrochemical Deposition of Copper on n-Si/TiN," Journal of The Electrochemical Society, Inc., vol. 146, No. 4, pp. 1436-1441, Apr. 1999, The Electrochemical Society, Inc., Pennington, New Jersey.

Palmans, R. and Maex, K., "Development of an Electroless Copper Deposition Bath for Via Fill Applications on Tin Seed Layers," Advanced Metallization for ULSI Applications in 1994, Proceedings of the Conference held Oct. 4-6, 1994 in Austin, Texas, R. Blumenthal and G. Janssen, editors, pp. 87-94, Mar. 1995, Materials Research Society, Pittsburgh, Pennsylvania.

Pearlstein, F., "Chapter 31: Electroless Plating," Modern Electroplating, Third Edition, F.A. Lowenheim, editor, pp. 710-747, Jun. 1974, Wiley-Interscience, New York.

Reid, J. et al., "Optimization of Damascence Feature Fill for Copper Electroplating Process," Shipley Company, Marlborough, Massachusetts, date n a.

Reid, J.D. and David, A.P., "Impedance Behavior of a Sulphuric Acid-Cupric Sulfate/Copper Cathode Interface," Journal of the Electrochemical Society, vol. 134, No. 6, pp. 1389-1394, Jun. 1987, The Electrochemical Society, Inc., Pennington, New Jersey.

Ritzdorf, T. et al., "Comparative Investigation of Plating Conditions on Self-Annealing of Electrochemically Deposited Copper Films," 3 pages, Semitool, Inc., Electrochemical Deposition Division, Kalispell, Montana, date n a.

Sato, N., "Toward a More Fundamental Understanding of Corrosion Processes," Corrosion, vol. 45, No. 5, pp. 354-367, May 1989, National Association of Corrosion Engineers, Houston, Texas.

Schlesinger, M., "Chapter 18: Electroless Deposition of Nickel," Modern Electroplating, Fourth Edition, Schlesinger, M. Schlesinger and M. Paunovic, editors, pp. 667-684, Aug. 10, 2000, Wiley-Interscience, New York.

Shacham-Diamand, Y. et al., "0.35 μm Cu-Filled Via Holes By Blanket Deposited Electroless Copper on Sputtered Seed Layer," 3 pages, Cornell University, School of Electrical Engineering and National Nanofabrication Facility, Ithica, New York, and Sematech, Austin, Texas, date n a.

Shacham-Diamand, Y. et al., "Electroless Copper Deposition for ULSI," Thin Solid Films, vol. 262, pp. 93-103, Jun. 1995, Elsevier Science S.A., New York.

Shacham-Diamand, Y., "Chapter 10: Electroless Copper for Micropackaging and Ultralarge-Scale Integrated Circuit Applications," Materials for Electronic Packaging, D.D.L. Chung, editor, pp. 221-240, Apr. 1995, Butterworth-Heinemann, Boston.

Smy, T. et al., "Simulation of Electroless Deposition of Cu Thin Films for Very Large Scale Integration Metallization," Journal of The Electrochemical Society, vol. 144, No. 6, pp. 2115-2122, Jun. 1997, The Electrochemical Society, Inc., Pennington, New Jersey.

Speckmann, H.-D. et al., "The Growth and Reduction of Duplex Oxide Films on Copper," Ber. Bunsenges. Phys. Chem., vol. 89, pp. 392-402, 1985, VCH Verlagsgesellschaft mbH, Weinheim, Germany, month n a.

Sridhar, P. and Subrahmanya, R.S., "Direct Current and Complex Plane Polarographic Behaviour of Copper (II)—EDTA Complexes," Indian Journal of Chemistry, vol. 21A, pp. 953-957, Oct. 1982, New Delhi.

Steigerwald, J.M. et al., "Electrochemical Potential Measurements during the Chemical-Mechanical Polishing of Copper Thin Films," Journal of The Electrochemical Society, vol. 142, No. 7, pp. 2379-2385, Jul. 1995, The Electrochemical Society, Inc., Pennington, New Jersey.

Stone, F.E., "Chapter 13: Electroless Copper In Printed Wiring Board Fabrication," Electroless Plating: Fundamentals & Applications, G.O. Mallory and J.B. Hajdu, editors, pp. 331-375, Dec. 1990, Noyes Publications.

Strehblow H.-H. and Titze, B., "The Investigation of the Passive Behaviour of Copper in Weakly Acid and Alkaline Solutions and the Examination of the Passive Film by ESCA and ISS," Electrochimica Acta, vol. 25, pp. 839-850, 1980, Pergamon Press Ltd., Great Britain, month n a.

Taylor, T. et al., "Electrolyte Composition Monitoring For Copper Interconnect Applications," Electrochemical Processing in ULSI Fabrication I and Interconnect and Contact Metallization, P.C. Andricacos et al., editors, Winter 1999, 26 pages, The Electrochemical Society, Inc., Pennington, New Jersey, presented at 193rd meeting of The Electrochemical Society, San Diego, California, May 3-8, 1998.

Visco, R.E., "Chapter 8: Gold," Modern Electroplating, Third Edition, F.A. Lowenheim, editor, pp. 224-244, Jun. 1974, Wiley-Interscience, New York.

Wünsche, M. et al., "Morphology and Stability of Electrochemically Generated Copper Layers: The Effect of Electron Transfer and Nucleation Kinetics," Circuit World, vol. 22, No. 3, pp. 4-9, Emerald, Cambridge, Massachusetts, date n a.

Yamamoto, Y. et al., "Self-Assembled Layers of Alkanethiols on Copper for Protection Against Corrosion," Journal of The Electrochemical Society, vol. 140, No. 2, pp. 436-443, Feb. 1993, The Electrochemical Society, Inc., Pennington, New Jersey.

Yoshiki, H. et al., "Adhesion Mechanism of Electroless Copper Film Formed on Ceramic Substrates Using ZnO Thin Film as an Intermediate Layer," Journal of The Electrochemical Society, vol. 145, No. 5, pp. 1430-1434, May 1998, The Electrochemical Society, Inc., Pennington, New Jersey.

* cited by examiner

MICROELECTRONIC WORKPIECE FOR ELECTROCHEMICAL DEPOSITION PROCESSING AND METHODS OF MANUFACTURING AND USING SUCH MICROELECTRONIC WORKPIECES

TECHNICAL FIELD

The present invention relates to microelectronic workpieces with barrier layers and seed layers that are configured for electrochemical deposition processing, and methods of making and using such microelectronic workpieces.

BACKGROUND

Microelectronic devices, such as semiconductor devices, field emission displays, read/write heads, and other products that include integrated circuits, are generally fabricated on and/or in microelectronic workpieces using several different types of machines ("tools"). Many such processing machines have a single processing station that performs one or more procedures on the workpieces. In a typical fabrication process, for example, one or more layers of conductive materials are formed on the workpieces during deposition stages. The workpieces are then typically etched and/or planarized (i.e., chemical-mechanical planarization) to remove an "overburden" portion of the deposited conductive layers and thus form electrically isolated contacts and/or interconnect lines.

Plating tools that plate metals or other materials onto the workpieces are becoming an increasingly useful type of processing tool. Electroplating and electroless plating techniques can be used to deposit copper, solder, permalloy, gold, silver, platinum, polymeric materials and other materials onto workpieces for forming blanket layers or patterned layers. A typical copper plating process involves depositing a barrier layer on the workpiece that conforms to micro-recesses and other features and then depositing a copper seed layer onto the barrier layer using chemical vapor deposition (CVD), physical vapor deposition (PVD), electroless plating, or other suitable deposition processes. After forming the seed layer, a blanket layer or patterned layer of copper is plated onto the workpiece by applying an appropriate electrical potential between the seed layer and another electrode in the presence of an electroprocessing solution (i.e., an acidic electrolyte). The workpiece is then cleaned, etched, and/or annealed in subsequent procedures before transferring the workpiece to other processing machines.

FIG. 1 schematically illustrates an embodiment of a single-wafer processing station 1 that includes a container 2 for receiving a flow of electroplating solution from a fluid inlet 3 at a lower portion of the container 2. The processing station 1 can include an anode 4, a plate-type diffuser 6 having a plurality of apertures 7, and a workpiece holder 9 for carrying a workpiece 5. The workpiece holder 9 can include a plurality of electrical contacts arranged to circumscribe a first diameter. The contacts of the workpiece holder 9 contact a perimeter portion of the workpiece for providing electrical current to the seed layer on the surface of the workpiece 5. When the seed layer is biased with a negative potential relative to the anode 4, it acts as a cathode. In operation, the electroplating fluid flows around the anode 4, through the apertures 7 in the diffuser 6, and against the plating surface of the workpiece 5. The electroplating solution is typically an acidic electrolyte that conducts electrical current between the anode 4 and the cathodic seed layer on the surface of the workpiece 5. Therefore, ions in the electroplating solution plate the surface of the workpiece 5.

The plating machines used in fabricating microelectronic devices must meet many specific performance criteria. For example, many processes must be able to form small contacts in submicron recesses, such as vias that are less than 0.5 micron wide and are desirably on the order of 0.1 micron wide. The plated metal layers should also be of a uniform thickness across the surface of the workpiece 5. One factor that influences the uniformity of the plated layer, and especially the integrity of the plated material in the submicron micro-recesses, is the current density across the surface of the workpiece.

Another objective of electrochemical deposition processes according to the prior art is to maximize the real estate available for forming integrated circuits on the workpiece. Existing contact assemblies typically include a plurality of fingers that project radially inwardly from a ring. Each of the fingers includes a contact point, and the contact points are typically arranged to circumscribe a circle with a slightly small diameter than the workpiece. To maximize the available real estate for forming integrated circuits, the diameter circumscribed by the contact points is typically selected to be as close to the perimeter edge of the workpiece as possible. Therefore, a significant number of tool manufacturers have expended significant resources to develop contact rings that minimize the distance that the contacts extend radially inwardly from the perimeter edge of the workpiece.

Although electrochemical deposition processes are widely used in semiconductor fabrication applications, it is becoming difficult to form uniform layers that completely fill the submicron micro-recesses. One factor contributing to the difficulty of electrochemical deposition processes is that very thin seed layers are necessary to fill 0.1–0.5 micron recesses. The ultrathin seed layers are typically discontinuous layers of copper that do not uniformly cover the topography of the workpieces. As a result, an IR drop occurs across thin seed layers, and the amount of copper that each contact engages varies across the workpiece. The IR drop is exacerbated because oxidation greatly impairs the conductivity of the copper seed layer. Moreover, acidic electroplating baths momentarily etch the copper seed layer before an electrical current is established in the bath causing a further reduction of conductivity. Thus, reduced conductivity of the copper seed layer further increases the IR drop.

The IR drop across the seed layer and the non-uniformities of ultrathin seed layers having a thickness of between 100–1000 Å cause a non-uniform current distribution in which the electrical current at the center of the workpiece is less than the current at the perimeter for an initial portion of the plating cycle. This produces non-uniform surfaces across the workpiece and voids within the submicron micro-recesses. Therefore, the semiconductor industry is currently seeking to reduce such non-uniformities and voids associated with electrochemical deposition processes.

SUMMARY

The present invention is directed toward methods for forming microelectronic workpieces used in electrochemical deposition processes, methods of depositing a conductive layer on a microelectronic workpiece, and articles for electrochemical deposition in semiconductor fabrication. One aspect of the invention is directed toward methods for forming microelectronic workpieces that are well-suited for electrochemical deposition processes. An embodiment of such a method comprises depositing a first conductive material on a workpiece to form an electrically conductive first layer that conforms to the workpiece. This embodiment further includes forming a seed region defined by a second layer of a second conductive material on the first layer and forming a contact region defined by an exposed portion of the first layer that is not covered by the second layer. The contact region can extend around at least a portion of the perimeter of the workpiece.

Another embodiment of a method for forming a microelectronic workpiece in accordance with the invention includes depositing a first conductive material on the workpiece, depositing a second conductive material over the first conductive material, and forming a contact region around a perimeter of the workpiece. The first material is a conductive material that forms an electrically conductive contact layer which conforms to submicron recesses in the workpieces. The second material is a different conductive material that is deposited onto the contact layer to form a seed layer. The second conductive material, for example, can be copper. The contact region is an exposed portion of the contact layer that extends radially inwardly from an edge of the workpiece. The contact region, for example, can be an annular band of the first material around the perimeter of the workpiece that is configured to directly engage the contact points of a workpiece holder used in electrochemical deposition chambers. The contact region can be formed by patterning a resist layer in an annular band around the perimeter of the workpiece and then depositing the second conductive material on the contact layer. Alternatively, the contact region can be formed by depositing the second conductive material over the entire surface area of the workpiece and then etching a portion of the second conductive material from the perimeter of the workpiece.

Another aspect of the invention is a method of depositing a conductive layer on a microelectronic workpiece. In one embodiment, such a method includes depositing a first conductive material on the workpiece to form an electrically conductive contact layer that conforms to submicron recesses in the workpiece and then disposing a second conductive layer on the contact layer to form a seed layer. The method also includes forming a contact region around a perimeter portion of the workpiece that is defined by an exposed portion of the contact layer extending radially inwardly from an edge of the workpiece. The method continues by electroplating additional material onto the seed layer in a plating process that includes engaging an electrical contact directly with the contact region and applying a current directly to the contact region in the presence of an electroplating solution.

Another aspect of the invention is an article for electrochemical deposition of a conductive layer on a workpiece in the fabrication of microelectronic circuits. In one embodiment, such an article includes a workpiece having a plurality of submicron micro-components that define integrated circuits, a first layer on the workpiece, and a second layer over the first layer. The first layer is composed of a first electrically conductive material, and the first layer covers an area of the workpiece having a first diameter. The second layer defines a seed layer composed of a second conducive material different than the first material. The second layer covers an area of the workpiece having a second diameter less than the first diameter such that a portion of the first layer along a perimeter edge of the workpiece is exposed. The exposed portion of the first layer defines a contact region for directly engaging contacts of a workpiece holder.

Another embodiment of an article for electrochemical deposition of a conductive layer on a workpiece includes a workpiece having a plurality of submicron micro-components that define integrated circuits, a barrier layer on the workpiece, and a seed layer over the barrier layer. The barrier layer is composed of a first electrically conductive material. The seed layer is composed of a second conductive material different than the first material, and the seed layer covers only a portion of the barrier layer to leave an exposed portion of the barrier layer along a perimeter edge of the workpiece.

DETAILED DESCRIPTION

The following disclosure describes methods for forming microelectronic workpieces used in electrochemical deposition processes, methods of depositing conductive layers on microelectronic workpieces, and articles for electrochemical deposition of conductive layers on workpieces in the fabrication of microelectronic circuits. As used herein, the terms "micro-device workpiece" and "microelectronic workpiece" include semiconductor wafers, field emission displays, read/write heads, micro-mechanical devices, and other types of devices that have very small components. Several embodiments of the invention are described below with reference to FIGS. 2–6C, but it will be appreciated that the invention can include other embodiments not shown in these figures. For example, aspects of the invention can include embodiments that do not have all of the features disclosed in FIGS. 2–6C, or other embodiments can include features in addition to those disclosed in these figures. Additionally, the embodiments disclosed in FIGS. 2–6C are directed toward forming damascene conductive lines, but it will be appreciated that they can also be used to form dual-damascene conductive lines, interlayer contacts, and other components in microdevice workpieces. It will be appreciated that several aspects of the invention are particularly suitable for fabricating submicron components on the order of 0.1–0.75 micron or even less than 0.1 micron, but many aspects of the invention may also be useful to fabricate components larger than one micron.

Figure 1:
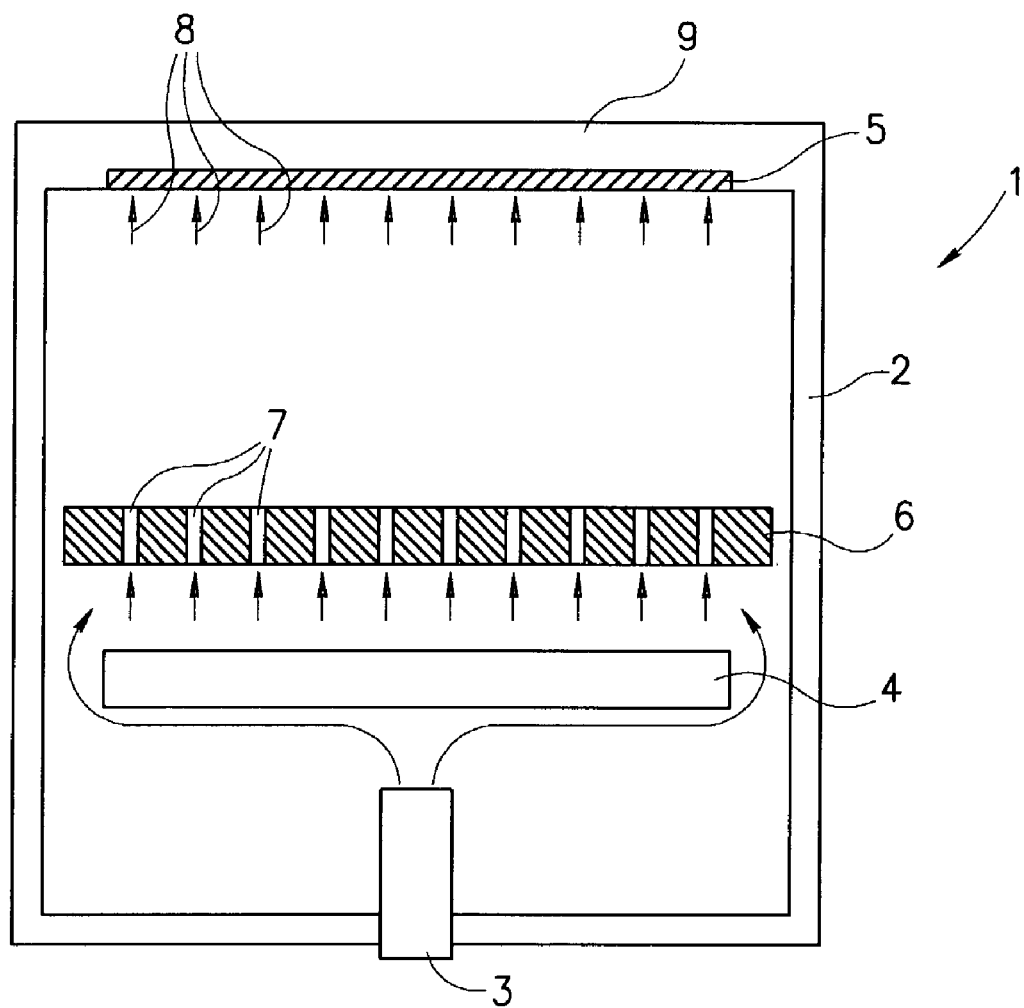
FIG. 1 is a schematic cross-sectional view of an electrochemical deposition chamber in accordance with the prior art.
Figure 2A:
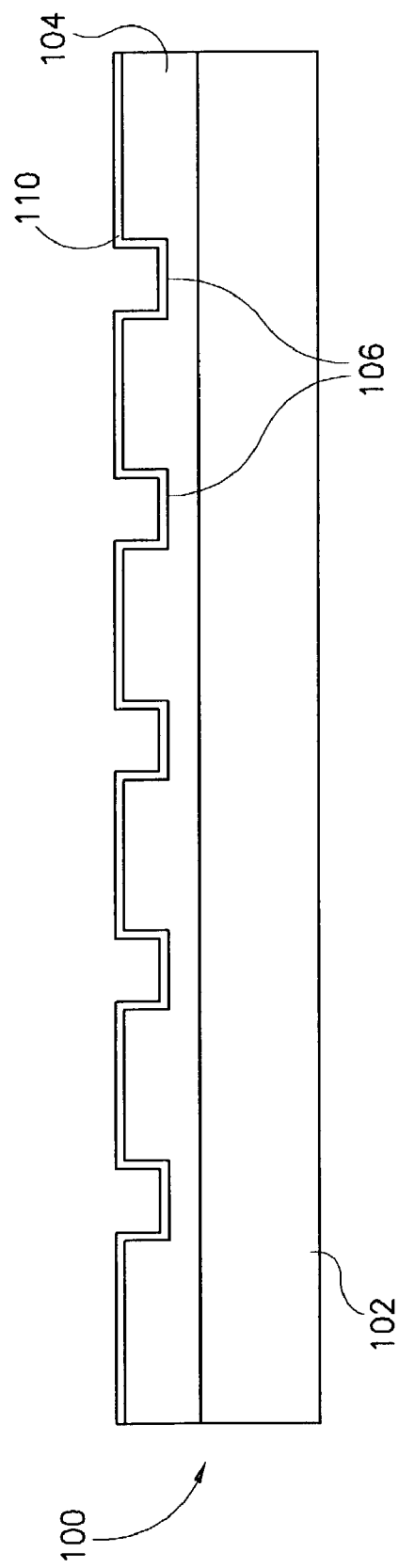
FIGS. 2A–2C are schematic cross-sectional views illustrating a method for forming a workpiece in accordance with an embodiment of the invention.

FIG. 2A is a schematic cross-sectional view of a workpiece 100 at one stage of a method in accordance with an embodiment of the invention. The workpiece 100 includes a substrate 102 and a dielectric layer 104 over the substrate 102. The substrate 102 can be a semiconductor substrate that includes a plurality of cells with transistors, shallow trench isolation structures, and other components. The substrate 102 can alternatively be a glass substrate or other material for other types of micro-devices. The dielectric layer 104 is typically a silicon dioxide, a borophosphate silicon glass, a tetraethylorthosilicate, or other suitable dielectric material. In the particular embodiment shown in FIG. 2A, the dielectric layer 104 includes a plurality of micro-recesses 106 that can be contact holes, trenches, or other structures. The micro-recesses 106 typically have a sub-micron width on the order of 0.1–0.5 microns and a depth that can be significantly greater than the width. For example, the aspect ratio of the micro-recesses 106 can range from 3–8. The workpiece 100 also includes a first layer 110 of a first conductive material. The first layer 110 can be a barrier layer composed of tantalum, tungsten, a titanium-tungsten alloy, or other suitable materials that provide good adhesion to the dielectric layer 104 and inhibit migration of bulk fill material to the dielectric layer 104 and/or the substrate 102. The barrier layer is typically deposited to a thickness of 100–5000 Å using chemical vapor deposition, physical vapor deposition, or atomic layer deposition processes.

Figure 2B:
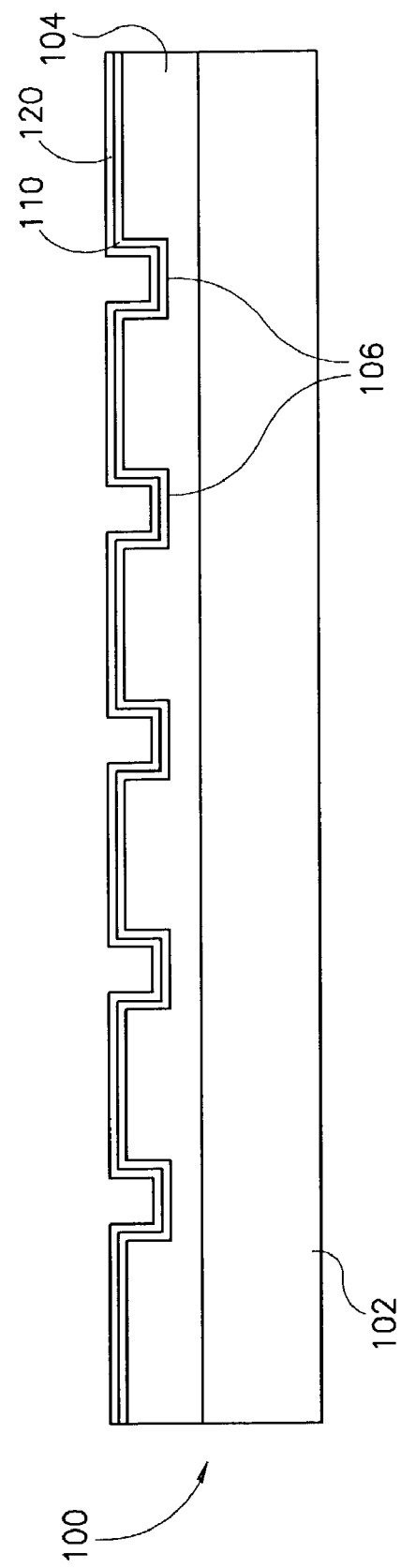

FIG. 2B is a schematic cross-sectional view illustrating a subsequent stage of forming a microelectronic workpiece. A second layer 120 of a second conductive material is deposited over the first layer 110 using chemical vapor deposition, physical vapor deposition, atomic layer deposition and/or electroless plating processes. The second layer 120 typically defines a seed layer for electroplating additional material onto the workpiece 100 in a manner that fills the micro-recesses 106 with the plated material. For example, to fill the micro-recesses 106 with copper, the second layer 120 is typically a copper seed layer. It will be appreciated that other materials can be used for the second layer 120 to plate other types of metals or polymeric materials onto the workpiece 100. The second layer 120 can be deposited to a thickness of approximately 100–1000 Å, and generally more preferably to a thickness of 200–500 Å. When the second layer 120 is a copper seed layer having a thickness of approximately 100–300 Å, it is generally discontinuous and has several voids (not shown in FIG. 2B). The discontinuity of thin copper seed layers is subject to creating large voids in the plated layer within the micro-recesses. Additionally, copper seed layers are subject to oxidation, which reduces the conductivity of the seed layers. The combination of thin copper seed layers and oxidation causes a drop in the current density from the edge to the center of the workpiece 100 when an electrical contact is engaged directly with the second layer 120 at the perimeter of the workpiece 100.

Figure 2C:
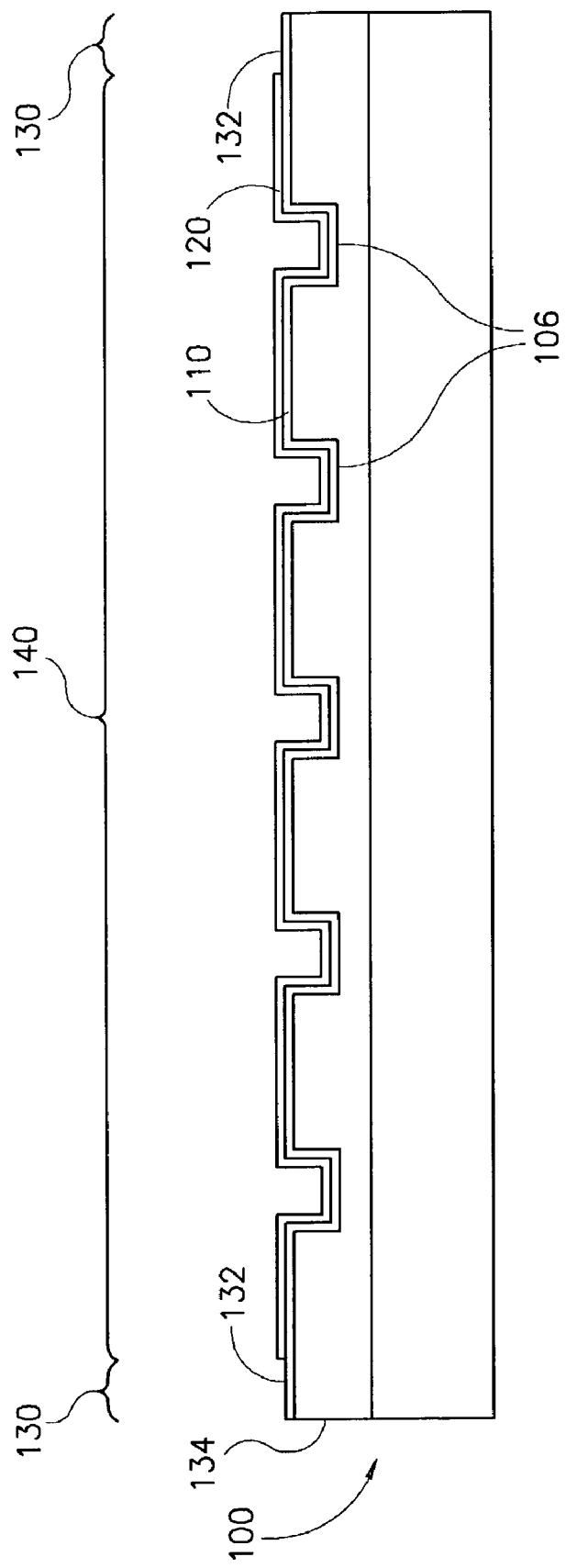

FIG. 2C is a schematic cross-sectional view of the workpiece 110 at a subsequent stage of the method. This stage of the method involves forming a contact region 130 around a perimeter of the workpiece and a seed region 140 within the contact region 130. The contact region 130 in this embodiment is defined by an exposed portion 132 of the first layer 110 that extends radially inwardly from an edge 134 of the workpiece 100 to the perimeter of the second layer 120. The exposed portion 132 of the first layer 110 is not covered by the second material of the second layer 120. The contact region 130 can be an annular band extending around the perimeter edge of the workpiece 100. The contact region 130 can have a radial width of approximately 1–10 millimeters, and more preferably a radial width of approximately 2–5 millimeters. The seed region 140 is thus defined by the second layer 120. As a result, the first layer 110 covers the surface of the workpiece 100 across an area having a first diameter, and the second layer 120 covers an area of the first layer 110 having a second diameter less than the first diameter such that a portion of the first layer 110 is exposed along the perimeter edge 134 of the workpiece 100. The embodiment of the workpiece 100 shown in FIG. 2C is suitable for subsequent electrochemical deposition processing in which a plurality of electrical contacts touch the exposed portion 132 of the first layer 110 to apply an electrical current directly to the first layer 110 without first applying the electrical current to the second layer 120.

The contact region 130 shown in FIG. 2C can be formed by depositing a layer of resist over the initial deposition of the second layer 120 shown in FIG. 2B (resist not shown). The layer of resist is then patterned and removed around the perimeter of the workpiece, and then the perimeter portion of the second layer 120 is etched away to expose the portion 132 of the first layer 110 shown in FIG. 2C. Suitable photo-patterning and etching processes are well known to those skilled in the art and not described here.

Figure 3:
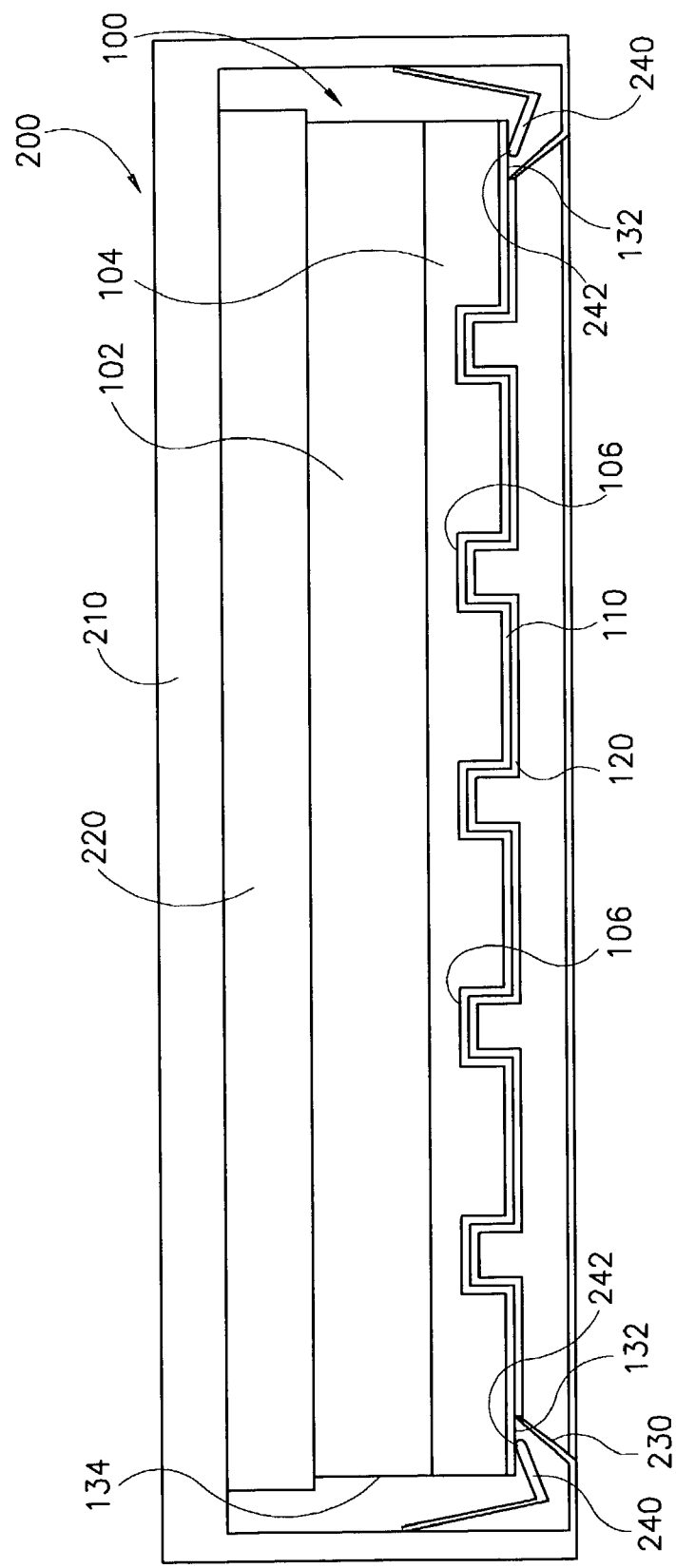
FIG. 3 is a schematic cross-sectional view of a workpiece in accordance with an embodiment of the invention loaded into a workpiece holder for an electrochemical deposition process in accordance with a method of the invention.

FIG. 3 is a schematic cross-sectional view of the workpiece 100 in a workpiece holder 200 used for electroplating additional material onto the second layer 120. The workpiece holder 200 includes a housing 210, a movable backing plate 220 in one portion of the housing, and an annular rim 230 spaced apart from the backing plate 220. The workpiece holder 200 also includes a plurality of contacts 240 arranged in a circle within the rim 230. Each contact 240 includes a contact point 242 that is configured to engage the workpiece 100. The contact points 242 are generally arranged to circumscribe a circle having a diameter that extends radially inwardly relative to the edge 134 of the workpiece 100.

The workpiece 100 is loaded into the workpiece holder 200, and then the backing plate 220 and/or the annular rim 230 moves to press the contact points 242 directly against the exposed portion 132 of the first layer 110. The lip of the rim 230 also preferably engages the workpiece 100 to form a seal radially inward from the contact points 242. It will be appreciated, however, that certain embodiments can be wet-contact plating processes that do not engage a rim with the workpiece. The contact points 242 accordingly directly engage the surface of the first layer 110 in the contact region to apply an electrical current directly to the first layer. Because the first layer 110 is conductive, the electrical current initially passes through the first layer 110 to provide a uniform current distribution across the workpiece 100. The conductive second layer 120 accordingly conducts the electrical current distributed through the first layer 110 to provide a uniform current distribution across the second layer 120.

Figure 4:
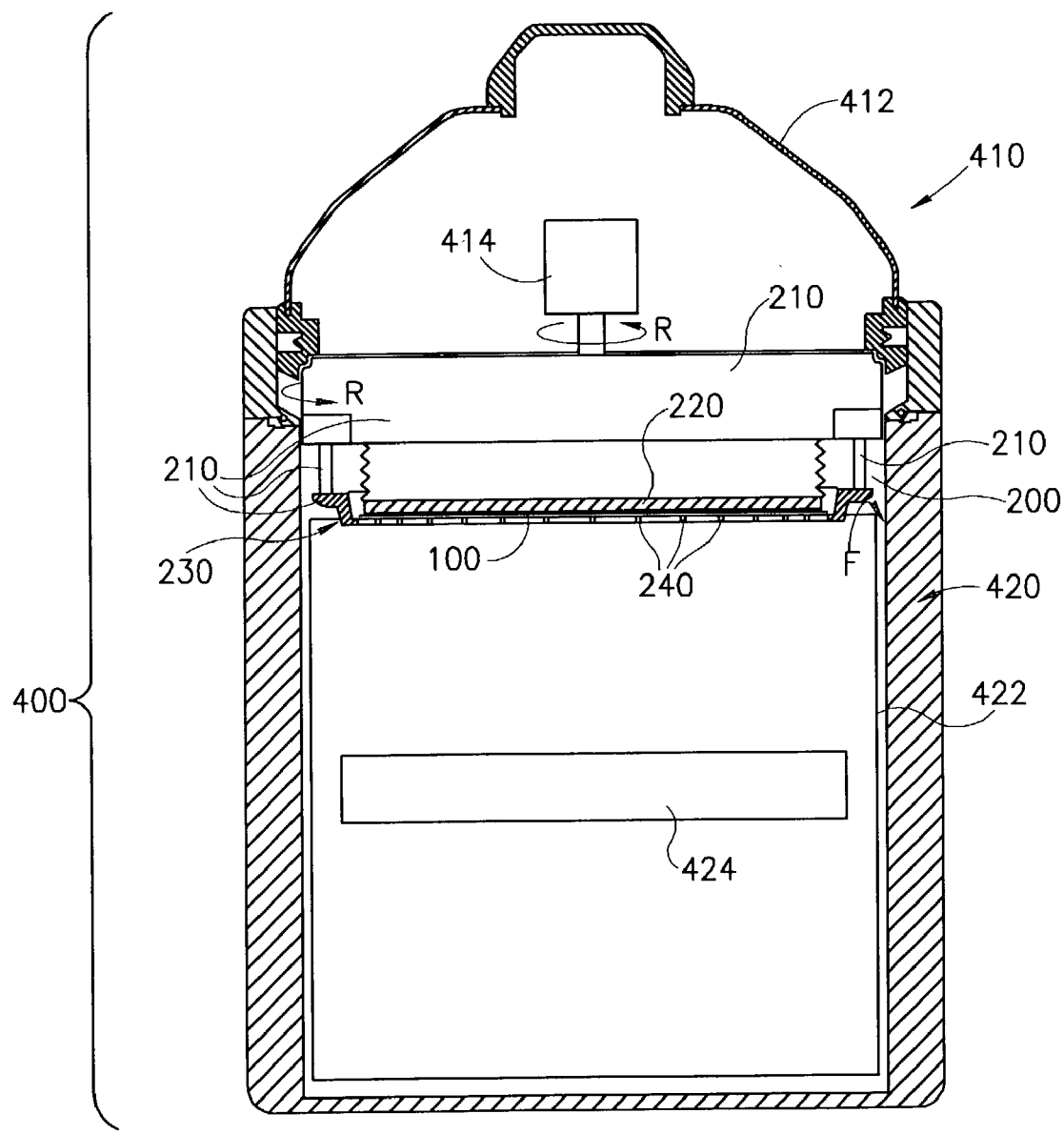
FIG. 4 is a schematic cross-sectional view of an electrochemical deposition chamber for electroplating workpieces in accordance with embodiments of the invention.

FIG. 4 is a schematic cross-sectional view showing an electroplating process for bulk plating material onto the workpiece 100 using the workpiece holder 200 shown in FIG. 3. In operation, the workpiece holder 200 positions the workpiece 100 in a bath of an electroplating solution. As shown in FIG. 4, the workpiece 100 is plated in an electrochemical deposition chamber 400 that includes an upper unit 410 having a head 412 that carries the workpiece holder 200. The ECD chamber 400 also includes a lower unit 420 that has a bowl 422 for containing an electrolyte bath and an electrode 424 positioned in the bowl 422. More specifically, the head 412 can include a rotor 414 that rotatably carries the workpiece holder 200. The head 412 positions the workpiece 100 so that the flow of electrolytic solution engages the face of the workpiece 100. Additionally, an electrical field is established in the electrolytic solution by applying a potential to the electrode 424 in the bowl 422 and the electrodes 240 contacting the contact region of the workpiece 100. The ions in the electrolytic bath accordingly attach to the second layer 120 (FIG. 2C) of the workpiece 100 to fill the micro-recesses 106 (FIG. 2C) with the plated material.

The structure of the workpiece 100 shown in the embodiment of FIG. 2C is expected to provide a more uniform current distribution in the second layer 120 to produce more uniform plating in the micro-recesses 106. The conductive first layer 110 can be a continuous layer without voids even when it is very thin. For example, when the first layer 110 is a thin tantalum layer, it is not subject to including the voids and discontinuities of a thin copper layer. Additionally, thin tantalum layers are not subject to oxidation to the same extent as copper. Therefore, when the contacts 240 apply the current directly to the first layer 110 instead of the second layer 120, the electrical current is generally uniform through the tantalum layer 110. This accordingly produces a uniform current distribution through the second layer 120. As a result, by exposing the contact region on the first layer 110 and engaging the contact point 242 of the contacts 240 directly with the contact region, the embodiments of the workpiece 100 shown in FIG. 2C are expected to produce uniform plating across the face of the workpiece 100.

Figure 5A:
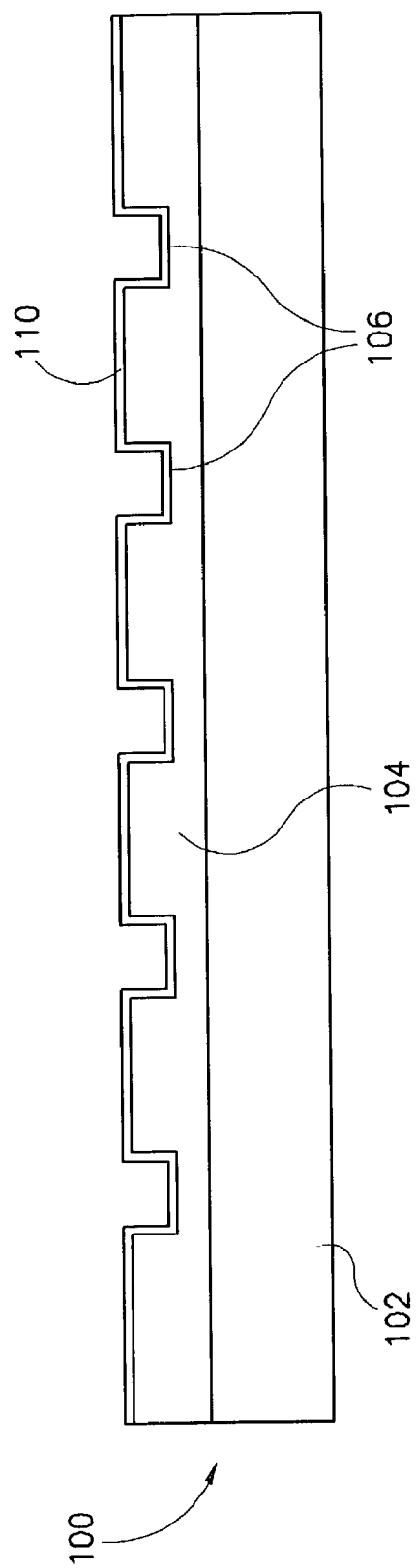
FIGS. 5A–5D are schematic cross-sectional views illustrating a method for fabricating a workpiece in accordance with another embodiment of the invention.
Figure 5B:
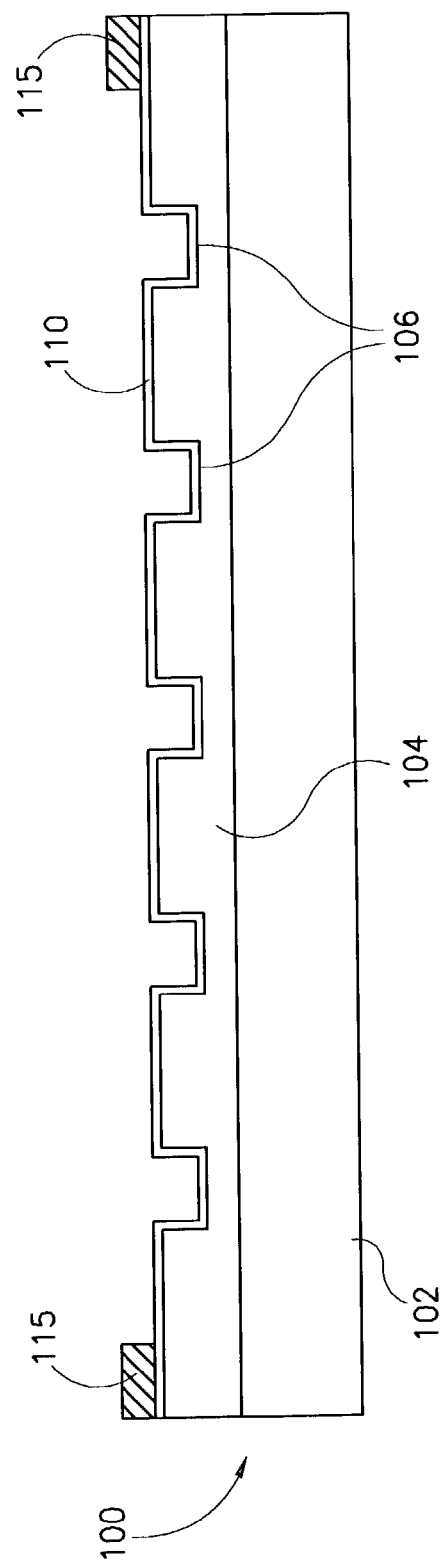
Figure 5C:
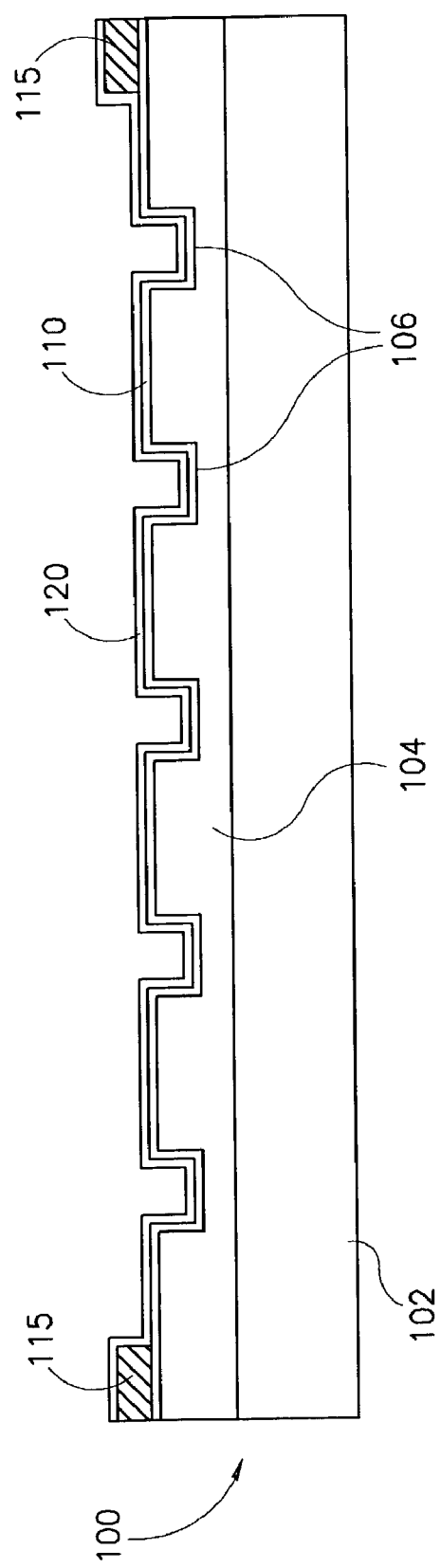
Figure 5D:
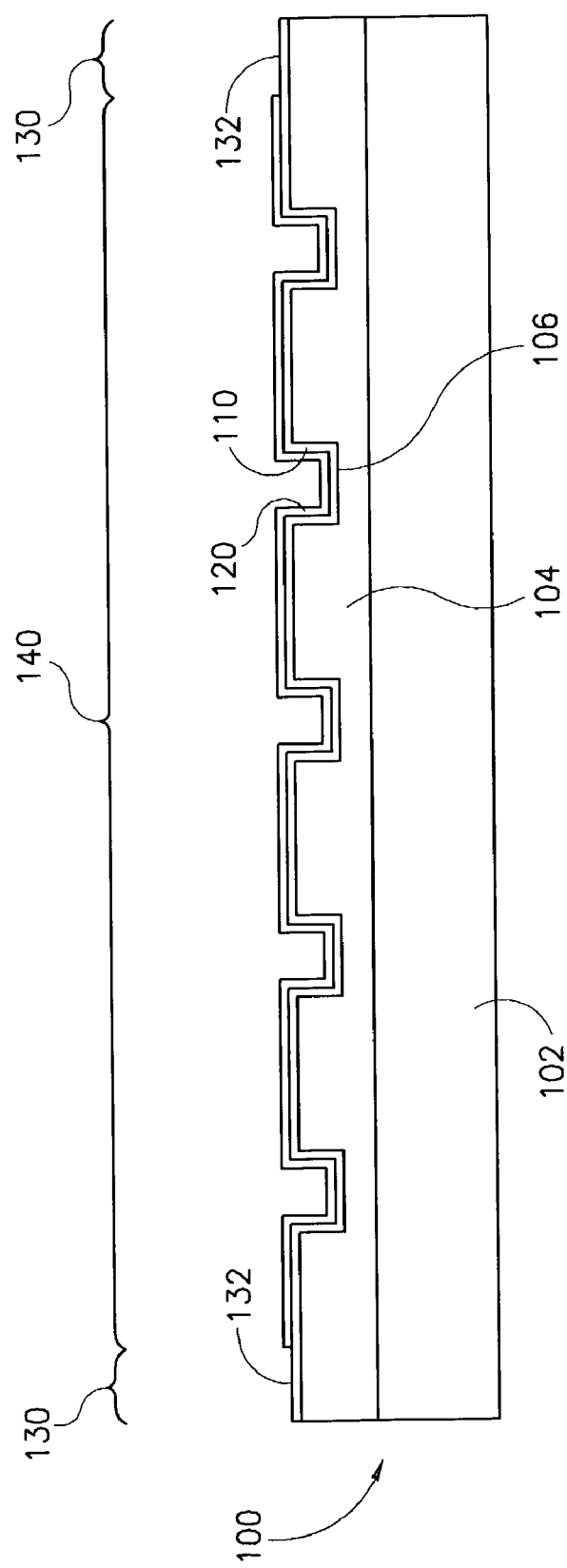

FIGS. 5A–5D are schematic cross-sectional views of another embodiment of the workpiece 100. Referring to FIG. 5A, the workpiece 100 includes the substrate 102, the dielectric layer with micro-recesses 106, and the first layer 110 as described above. FIG. 5B shows the workpiece 100 at a subsequent stage after a layer of resist has been deposited over the workpiece 100 and patterned to form at least one spacer 115 at the perimeter of the workpiece 100. The spacer 115 can be a continuous annular ring around the perimeter of the workpiece 100 over the first layer 110. Alternatively, a plurality of discrete spacers can be formed over areas where the first layer is to be exposed. FIG. 5C illustrates the workpiece 100 at a subsequent stage of the method after having deposited the second layer 120 over the spacer 115 and the first layer 110. The workpiece 100 is then subject to a process in which the spacer 115 is removed by a suitable wash or etchant to undercut the perimeter portion of the second layer 120. FIG. 5D illustrates the workpiece 100 after removing the spacer 115, which may also remove the undercut portion of the second layer 120 to expose the surface 132 of the first layer 110 and thus define the contact region 130.

Figure 6A:
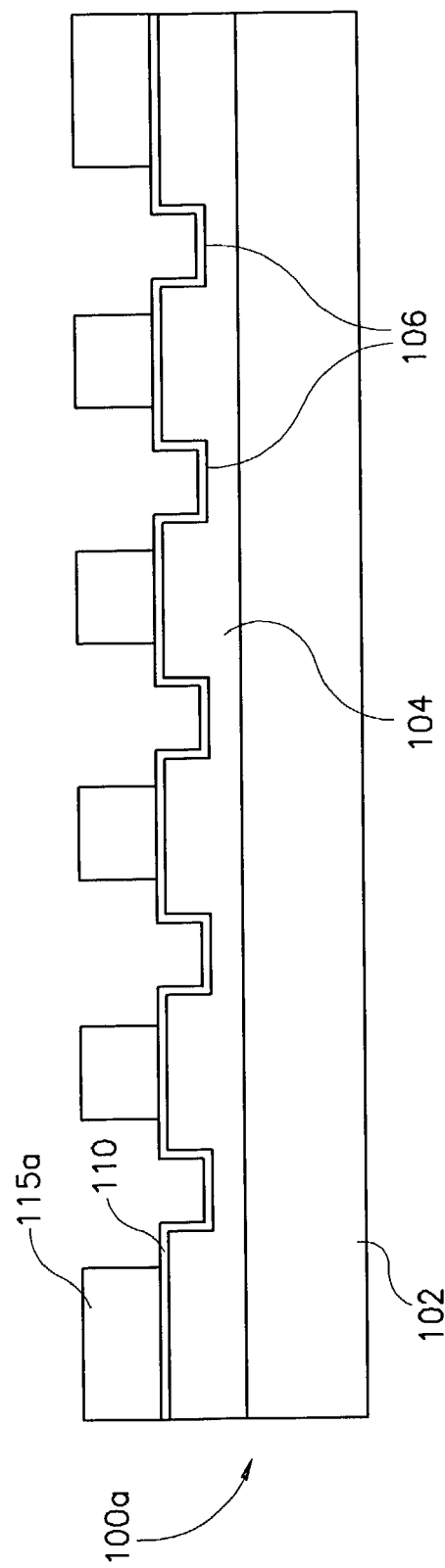
FIGS. 6A–6C are schematic cross-sectional views of a method for fabricating a workpiece in accordance with yet another embodiment of the invention.
Figure 6B:
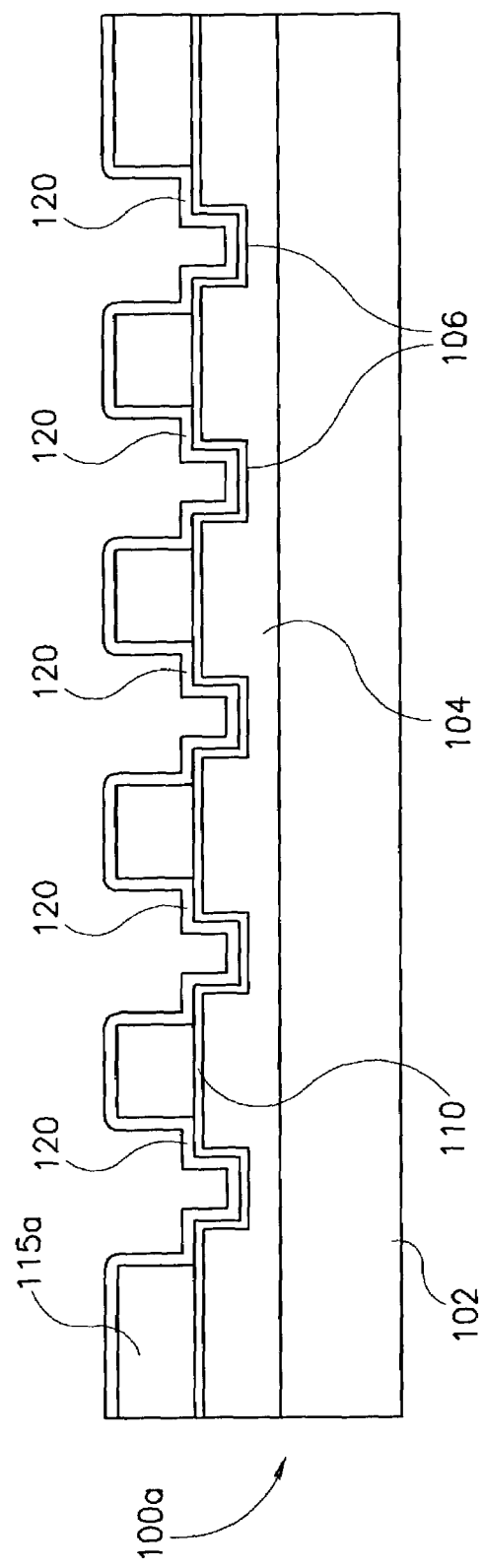
Figure 6C:
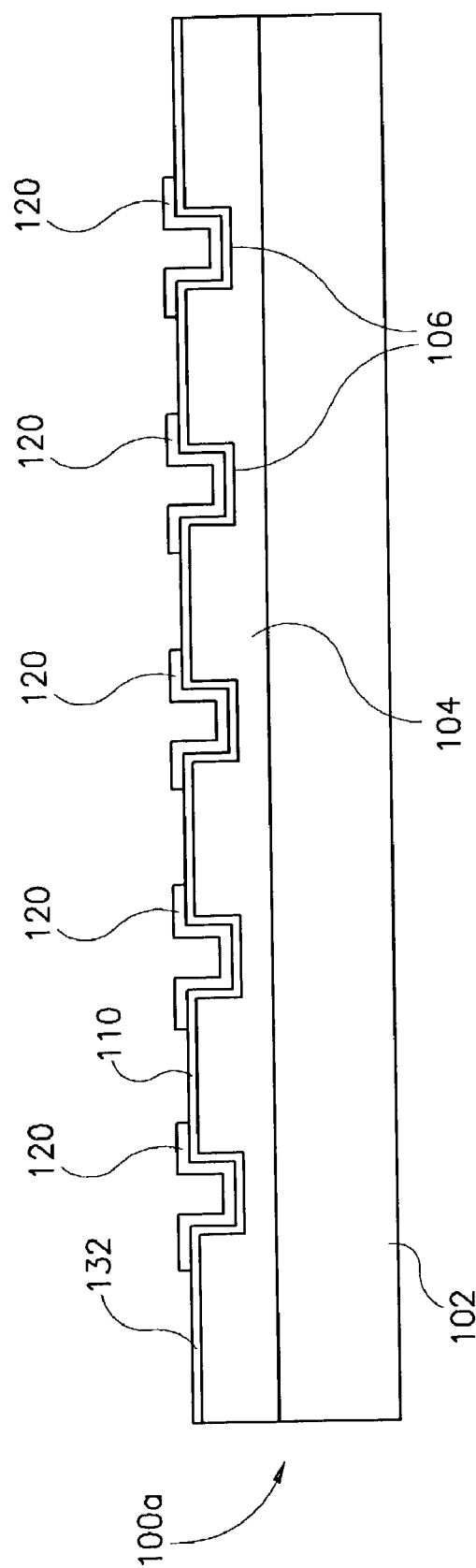

FIGS. 6A–6C are schematic views illustrating a workpiece 100a in accordance with yet another embodiment of the invention. Referring to FIG. 6A, the workpiece 100a has a substrate 102, a dielectric layer 104 with micro-recesses 106, and a first layer 110 as explained above. The workpiece 100a also has a layer of resist 115a which has been patterned to form large openings over the micro-recesses 106. FIG. 6B illustrates the workpiece 100a after a second layer 120 has been deposited over the first layer 110 and the resist layer 115a. FIG. 6C illustrates the workpiece 100a after removing the top portions of the second layer 120 and the resist layer 115a. To form the structure shown in FIG. 6C from the structure shown in FIG. 6B, the structure shown in FIG. 6B can be planarized to remove the top portions of the second layer 120 over the resist layer 115a, and then the resist 115a can be removed from the workpiece using a suitable wash or etchant that does not react with the second layer 120 or the first layer 110. The workpiece 100a shown in FIG. 6C can accordingly be loaded into a workpiece holder and electroplated as explained above.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method of forming a microelectronic workpiece for electrochemical deposition processing, comprising:
    depositing a first conductive material on the workpiece to form an electrically conductive contact layer that conforms to submicron recesses in the workpiece;
    disposing a second conductive material on at least a substantial portion of the contact layer to form a conformal and continuous seed layer;
    forming a contact region around a perimeter of the workpiece by removing the second conductive material from a perimeter region around the workpiece to expose the first conductive material in a perimeter band, the contact region being an exposed portion of the contact layer extending radially inwardly from an edge of the workpiece; and
    electroplating additional material onto the continuous seed layer by engaging an electrical contact directly with the contact region, contacting the continuous seed layer with an electrochemical solution, and applying a current directly to the contact region.

2. The method of claim 1 wherein forming the contact region comprises removing the second conductive material from a perimeter region around the workpiece to expose the first conductive material in a perimeter band having a width of approximately 1–10 mm.

3. The method of claim 1 wherein forming the contact region comprises removing the second conductive material from a perimeter region around the workpiece to expose the first conductive material in a perimeter band having a width of approximately 2–5 mm.

4. The method of claim 1 wherein:
    depositing the first conductive material on the workpiece comprises covering a first area having a first diameter with the first conductive material;
    disposing the second conductive material on the workpiece comprises applying the second conductive material directly onto the first conductive material over an area having a diameter at least approximate to the first diameter; and
    forming the contact region comprises etching a perimeter portion of the second conductive material so that the second conductive material covers a second area having a second diameter less than the first diameter.

5. The method of claim 1 wherein:
    depositing the first conductive material on the workpiece comprises covering a first area having a first diameter with the first conductive material;
    the method further comprises depositing a resist layer on the first conductive material and patterning the resist layer to form a spacer on the first conductive material before disposing the second conductive material on the first conductive material;
    disposing the second conductive material on the workpiece comprises applying the second conductive material directly onto the first conductive material over an area having a second diameter less than the first diameter and on the spacer; and
    forming the contact region comprises removing the second conductive material from the spacer and removing the spacer.

6. The method of claim 1 wherein:
depositing the first conductive material on the workpiece comprises depositing a barrier layer that inhibits migration of copper; and
disposing the second conductive material on at least a portion of the first conductive material comprises disposing a copper seed layer over the barrier layer.

7. The method of claim 6 wherein forming the contact region comprises removing the copper seed layer from a perimeter region around the workpiece to expose the first conductive material in a perimeter band having a width of approximately 2–5 mm.

8. The method of claim 6 wherein:
depositing the first conductive material on the workpiece comprises covering a first area having a first diameter with the barrier layer;
disposing the second conductive material on the workpiece comprises applying the copper seed layer directly onto the barrier layer over an area having a diameter at least approximate to the first diameter; and
forming the contact region comprises etching a perimeter portion of the seed layer so that the seed layer covers a second area having a second diameter less than the first diameter.

9. The method of claim 6 wherein:
depositing the first conductive material on the workpiece comprises covering a first area having a first diameter with the barrier layer;
the method further comprises depositing a resist layer on the barrier layer and patterning the resist layer to form spacers before disposing the copper seed layer on the barrier layer;
disposing the second conductive material on the workpiece comprises applying the seed layer directly on the spacers and on the barrier layer over an area having a second diameter less than the first diameter; and
forming the contact region comprises removing the second conductive material from the spacers and removing the spacers.

10. A method of forming a microelectronic workpiece for electrochemical deposition processing, comprising:
depositing a first conductive material on the workpiece to form an electrically conductive first layer that conforms to the workpiece;
forming a continuous seed region defined by a second layer of a second conductive material on the first layer and a contact region defined by an exposed portion of the first layer that is not covered by the second layer by removing the second conductive material from a perimeter region around the workpiece to expose the first conductive material in a perimeter band, wherein the contact region is around at least a perimeter portion of the workpiece; and
electroplating additional material onto the continuous seed layer by engaging an electrical contact directly with the contact region, contacting the continuous seed layer with an electrochemical solution, and applying a current directly to the contact region.

11. The method of claim 10 wherein forming the contact region comprises removing the second conductive material from a perimeter region around the workpiece to expose the first conductive material in a perimeter band having a width of approximately 2–5 mm.

12. The method of claim 10 wherein:
depositing the first conductive material on the workpiece comprises covering a first area having a first diameter with the first conductive material;
forming the seed region comprises disposing the second conductive material on the workpiece by applying the second conductive material directly onto the first conductive material over an area having a diameter at least approximate to the first diameter; and
forming the contact region comprises etching a perimeter portion of the second conductive material so that the second conductive material covers a second area having a second diameter less than the first diameter.

13. The method of claim 10 wherein:
depositing the first conductive material on the workpiece comprises covering a first area having a first diameter with the first conductive material;
the method further comprises depositing a resist layer on the first conductive material and patterning the resist layer to form spacers on the first conductive material before disposing the second conductive material on the first conductive material;
forming the seed region comprises disposing the second conductive material on the workpiece by applying the second conductive material directly onto the first conductive material over an area having a second diameter less than the first diameter and on the spacers; and
forming the contact region comprises removing the second conductive material from the spacers and removing the spacers.

14. The method of claim 10 wherein:
depositing the first conductive material on the workpiece comprises depositing a barrier layer that inhibits migration of copper; and
forming the seed region comprises disposing the second conductive material on at least a portion of the first conductive material by disposing a copper seed layer over the barrier layer.

15. A method of forming a microelectronic workpiece for electrochemical deposition processing in an ECD chamber having a workpiece holder including a plurality of contacts having contact points circumscribing a first diameter, the method comprising:
depositing a first conductive material on the workpiece to form a conformal barrier layer;
disposing a second conductive material on at least a portion of the barrier layer to form a continuous seed layer for a subsequent electrochemical deposition procedure;
forming a contact region comprising an exposed band of the barrier layer that is not covered by the second conductive material by removing the second conductive material from a perimeter region around the workpiece to expose the first conductive material in a perimeter band, the exposed band of the barrier layer having a diameter encompassing the first diameter circumscribed by the contact points of the workpiece holder; and
electroplating additional material onto the seed layer by engaging an electrical contact directly with the contact region, contacting the continuous seed layer with an electrochemical solution, and applying a current directly to the contact region.

16. The method of claim 15 wherein forming the contact region comprises removing the second conductive material from a perimeter region around the workpiece to expose the first conductive material in a perimeter band having a width of approximately 1–10 mm.

17. The method of claim 15 wherein forming the contact region comprises removing the second conductive material from a perimeter region around the workpiece to expose the first conductive material in a perimeter band having a width of approximately 2–5 mm.

18. The method of claim 15 wherein:
depositing the first conductive material on the workpiece comprises depositing a barrier layer that inhibits migration of copper; and
disposing the second conductive material on at least a portion of the first conductive material comprises disposing a copper seed layer over the barrier layer.

19. The method of claim 18 wherein forming the contact region comprises removing the copper seed layer from a perimeter region around the workpiece to expose the first conductive material in a perimeter band having a width of approximately 2–5 mm.

20. The method of claim 18 wherein:
depositing the first conductive material on the workpiece comprises covering a first area having a first diameter with the barrier layer;
disposing the second conductive material on the workpiece comprises applying the copper seed layer directly onto the barrier layer over an area having a diameter at least approximate to the first diameter; and
forming the contact region comprises etching a perimeter portion of the seed layer so that the seed layer covers a second area having a second diameter less than the first diameter.

21. A method of forming a microelectronic workpiece for electrochemical deposition processing, comprising:
depositing a first conductive material to form an electrically conductive barrier layer that conforms to the workpiece;
disposing a second conductive material on at least a portion of the barrier layer to form a continuous seed layer;
removing a portion of the seed layer around a perimeter portion of the workpiece to expose a portion of the barrier layer, wherein the exposed portion of the barrier layer defines a contact region configured to be directly engaged by an electrical contact; and
electroplating additional material onto the continuous seed layer by engaging the electrical contact directly with the contact region, contacting the continuous seed layer with an electrochemical solution, and applying a current directly to the contact region.

22. The method of claim 21 wherein:
depositing the first conductive material on the workpiece comprises depositing a barrier layer that inhibits migration of copper; and
disposing the second conductive material on at least a portion of the first barrier layer comprises disposing a copper seed layer over the barrier layer.

23. The method of claim 23 wherein forming the contact region comprises removing the copper seed layer from a perimeter region around the workpiece to expose the first conductive material in a perimeter band having a width of approximately 2–5 mm.

24. The method of claim 22 wherein:
depositing the first conductive material on the workpiece comprises covering a first area having a first diameter with the barrier layer;
disposing the second conductive material on the workpiece comprises applying the copper seed layer directly onto the barrier layer over an area having a diameter at least approximate to the first diameter; and
forming the contact region comprises etching a perimeter portion of the seed layer so that the seed layer covers a second area having a second diameter less than the first diameter.

25. A method of depositing a conductive layer on a microelectronic workpiece, comprising:
depositing a first conductive material on the workpiece to form an electrically conductive contact layer that conforms to submicron recesses in the workpiece;
disposing a second conductive material on the contact layer to form a continuous seed layer;
forming a contact region around a perimeter of the workpiece by removing the second conductive material from a perimeter region around the workpiece to expose the first conductive material in a perimeter band, the contact region being an exposed portion of the contact layer extending radially inwardly from an edge of the workpiece; and
electroplating additional material onto the continuous seed layer by engaging an electrical contact directly with the contact region and applying a current directly to the contact region in the presence of an electroplating solution.

26. The method of claim 25 wherein forming the contact region comprises removing the second conductive material from a perimeter region around the workpiece to expose the first conductive material in a perimeter band having a width of approximately 1–10 mm.

27. The method of claim 25 wherein forming the contact region comprises removing the second conductive material from a perimeter region around the workpiece to expose the first conductive material in a perimeter band having a width of approximately 2–5 mm.

28. The method of claim 25 wherein:
depositing the first conductive material on the workpiece comprises covering a first area having a first diameter with the first conductive material;
disposing the second conductive material on the workpiece comprises applying the second conductive material directly onto the first conductive material over an area having a diameter at least approximate to the first diameter; and
forming the contact region comprises etching a perimeter portion of the second conductive material so that the second conductive material covers a second area having a second diameter less than the first diameter.

29. The method of claim 25 wherein:
depositing the first conductive material on the workpiece comprises covering a first area having a first diameter with the first conductive material;
the method further comprises depositing a resist layer on the first conductive material and patterning the resist layer to form a spacer on the first conductive material before disposing the second conductive material on the first conductive material;
disposing the second conductive material on the workpiece comprises applying the second conductive material directly onto the first conductive material over an area having a second diameter less than the first diameter and on the spacer; and
forming the contact region comprises removing the second conductive material from the spacer and removing the spacer.

30. The method of claim 25 wherein:
depositing the first conductive material on the workpiece comprises depositing a barrier layer that inhibits migration of copper; and
disposing the second conductive material on at least a portion of the first conductive material comprises disposing a copper seed layer over the barrier layer.

31. The method of claim 30 wherein forming the contact region comprises removing the copper seed layer from a perimeter region around the workpiece to expose the first conductive material in a perimeter band having a width of approximately 2–5 mm.

32. The method of claim 30 wherein:
depositing the first conductive material on the workpiece comprises covering a first area having a first diameter with the barrier layer;
disposing the second conductive material on the workpiece comprises applying the copper seed layer directly onto the barrier layer over an area having a diameter at least approximate to the first diameter; and
forming the contact region comprises etching a perimeter portion of the seed layer so that the seed layer covers a second area having a second diameter less than the first diameter.

33. The method of claim 30 wherein:
depositing the first conductive material on the workpiece comprises covering a first area having a first diameter with the barrier layer;
the method further comprises depositing a resist layer on the barrier and patterning the resist layer to form a spacer before disposing the copper seed layer on the barrier layer;
disposing the second conductive material on the workpiece comprises applying the seed layer directly on the spacer and on the barrier layer over an area having a second diameter less than the first diameter; and
forming the contact region comprises removing the second conductive material from the spacer and removing the spacer.

34. A method of depositing a conductive layer on a microelectronic workpiece, comprising:
depositing a first conductive material on the workpiece to form an electrically conductive first layer that conforms to the workpiece;
forming a continuous seed region defined by a second layer of a second conductive material on the first layer and a contact region defined by an exposed portion of the first layer that is not covered by the second layer by removing the second conductive material from a perimeter region around the workpiece to expose the first conductive material in a perimeter band, wherein the contact region is around at least a perimeter portion of the workpiece; and
electroplating additional material onto the continuous seed region by engaging an electrical contact directly with the contact region and applying a current directly to the contact region in the presence of an electroplating solution.

35. The method of claim 34 wherein forming the contact region comprises removing the second conductive material from a perimeter region around the workpiece to expose the first conductive material in a perimeter band having a width of approximately 2–5 mm.

36. The method of claim 34 wherein:
depositing the first conductive material on the workpiece comprises covering a first area having a first diameter with the first conductive material;
forming the seed region comprises disposing the second conductive material on the workpiece by applying the second conductive material directly onto the first conductive material over an area having a diameter at least approximate to the first diameter; and
forming the contact region comprises etching a perimeter portion of the second conductive material so that the second conductive material covers a second area having a second diameter less than the first diameter.

37. The method of claim 34 wherein:
depositing the first conductive material on the workpiece comprises covering a first area having a first diameter with the first conductive material;
the method further comprises depositing a resist layer on the first conductive material and patterning the resist layer to form a spacer on the first conductive material before disposing the second conductive material on the first conductive material;
forming the seed region comprises disposing the second conductive material on the workpiece by applying the second conductive material directly onto the first conductive material over an area having a second diameter less than the first diameter and on the spacer; and
forming the contact region comprises removing the second conductive material from the spacer and removing the spacer.

38. The method of claim 34 wherein:
depositing the first conductive material on the workpiece comprises depositing a barrier layer that inhibits migration of copper; and
forming the seed region comprises disposing the second conductive material on at least a portion of the first conductive material by disposing a copper seed layer over the barrier layer.

39. A method of electrochemical deposition processing in an ECD chamber having a workpiece holder including a plurality of contacts having contact points circumscribing a first diameter, the method comprising:
depositing a first conductive material on a workpiece to form a conformal barrier layer;
disposing a second conductive material on at least a portion of the barrier layer to form a continuous seed layer for a subsequent electrochemical deposition procedure;
forming a contact region comprising an exposed band of the barrier layer that is not covered by the second conductive material by removing the second conductive material from a perimeter region around the workpiece to expose the first conductive material in a perimeter band, the exposed band of the barrier layer having a diameter encompassing the first diameter circumscribed by the contact points of the workpiece holder; and
electroplating additional material onto the continuous seed layer by engaging an electrical contact directly with the exposed band of the barrier layer, contacting the seed layer with an electrochemical solution, and applying a current directly to the exposed band of the carrier layer.

40. A method of depositing a conductive layer on a microelectronic workpiece, comprising:
depositing a first conductive material to form an electrically conductive barrier layer that conforms to submicron recesses in the workpiece;
disposing a second conductive material on the barrier layer to form a continuous seed layer;
removing a portion of the seed layer around a perimeter of the workpiece to expose a portion of the barrier layer by removing the second conductive material from a perimeter region around the workpiece to expose the first conductive material in a perimeter band, wherein the exposed portion of the barrier layer defines a contact region configured to be directly engaged by an electrical contact; and
electroplating additional material onto the continuous seed layer by engaging an electrical contact directly with the contact region, contacting the seed layer with an electrochemical solution, and applying a current directly to the contact region.

* * * * *

UNITED STATES PATENT AND TRADEMARK OFFICE
CERTIFICATE OF CORRECTION

PATENT NO. : 7,025,866 B2
APPLICATION NO. : 10/225585
DATED : April 11, 2006
INVENTOR(S) : Dale W. Collins It is certified that error appears in the above-identified patent and that said Letters Patent is hereby corrected as shown below:

On the Title Page, Item -56-
References Cited - Other Publications:
Please insert the following cited references:

--GROSS, M.E. et al., "Electroplated Damascene Copper: Process Influences On Recrystallization and Texture," Advanced Interconnects and Contacts, Materials Research Society Symposium Proceedings Volume 564, pp. 379-386, Materials Research Society, Warrendale, Pennsylvania, Symposium held April 5-7, 1999 in San Francisco, California.

GRUNOW, S. et al., "Study of Electrochemical Deposition of Copper and Microstructure Evolution in Fine Lines," Advanced Interconnects and Contacts, Materials Research Society Symposium Proceedings Volume 564, pp. 407-412, Materials Research Society, Warrendale, Pennsylvania, Symposium held April 5-7, 1999 in San Francisco, California.

HARPER, J.M.E. et al., "Mechanisms for Microstructure Evolution in Electroplated Copper Thin Films," Advanced Interconnects and Contacts, Materials Research Society Symposium Proceedings Volume 564, pp. 387-392, Materials Research Society, Warrendale, Pennsylvania, Symposium held April 5-7, 1999 in San Francisco, California.

JIANG, Q.T. et al., "Electroplated Cu Recrystallization in Damascene Structures at Elevated Temperatures," Advanced Interconnects and Contacts, Materials Research Society Symposium Proceedings Volume 564, pp. 429-434, Materials Research Society, Warrendale, Pennsylvania, Symposium held April 5-7, 1999 in San Francisco, California.

JIANG, Q.T. et al., "Influence of Cu Seed Deposition Temperature on Electroplated Cu Texture Formation in Damascene Structures," Advanced Interconnects and Contacts, Materials Research Society Symposium Proceedings Volume 564, pp. 393-398, Materials Research Society, Warrendale, Pennsylvania, Symposium held April 5-7, 1999 in San Francisco, California.

KANG, S. et al., "Relationship Between Texture and Surface Morphology Of Copper Electrodeposits," Plating & Surface Finishing, pp. 67-70, October 1995, American Electroplaters and Surface Finishers Society, Inc., Orlando, Florida.

KAUTEK W. and GORDON J.G., II, "XPS studies of Anodic Surface Films on Copper Electrodes," Journal of The Electrochemical Society, Vol. 137, No. 9, pp. 2672-2677, September 1990, The Electrochemical Society, Inc., Pennington, New Jersey.

UNITED STATES PATENT AND TRADEMARK OFFICE
CERTIFICATE OF CORRECTION

PATENT NO. : 7,025,866 B2
APPLICATION NO. : 10/225585
DATED : April 11, 2006
INVENTOR(S) : Dale W. Collins It is certified that error appears in the above-identified patent and that said Letters Patent is hereby corrected as shown below:

On the Title Page, Item -56-
References Cited - Other Publications:
Please insert the following cited references: (cont'd)

KELLY, J.J. and WEST, A.C., "Copper Deposition in the Presence of Polyethylene Glycol, I. Quartz Crystal Microbalance Study," Journal of The Electrochemical Society, Vol. 145, No. 10, pp. 3472-3481, October 1998, The Electrochemical Society, Inc., Pennington, New Jersey.--

Signed and Sealed this

Nineteenth Day of June, 2007

JON W. DUDAS
*Director of the United States Patent and Trademark Office*